United States Patent [19]
Clark et al.

[11] Patent Number: 4,714,831
[45] Date of Patent: Dec. 22, 1987

[54] SPHERICAL RETARDING GRID ANALYZER

[75] Inventors: Gregory J. Clark, Katonah; Praveen Chaudhari, Briarcliff Manor; Jerome J. Cuomo, Lincolndale; Margaret A. Frisch, Mahopac; James L. Speidell, Carmel, all of N.Y.

[73] Assignee: International Business Machines, N.Y.

[21] Appl. No.: 859,102

[22] Filed: May 1, 1986

[51] Int. Cl.[4] ............................................. H01J 40/04
[52] U.S. Cl. .................................. 250/305; 250/396 R
[58] Field of Search ........................ 250/305, 396 R; 313/349, 293, 295; 445/46, 49

[56] References Cited

U.S. PATENT DOCUMENTS

| | | | |
|---|---|---|---|
| 3,484,645 | 12/1967 | Drees | 313/349 |
| 3,818,228 | 6/1974 | Palmberg | 250/305 |
| 4,224,518 | 9/1980 | Taylor | 250/305 |
| 4,330,708 | 5/1982 | Meisburger | 250/396 ML |
| 4,439,684 | 3/1984 | Hemmerich et al. | 250/396 R |
| 4,464,571 | 8/1984 | Plies | 250/305 |
| 4,540,885 | 9/1985 | Plies et al. | 250/310 |

Primary Examiner—Bruce C. Anderson
Assistant Examiner—Paul A. Guss
Attorney, Agent, or Firm—Sughrue, Mion, Zinn Macpeak & Seas

[57] ABSTRACT

A spherical grid for use in instrumentation comprising a rigid non-magnetic frame having a pattern of holes. Into each hole a flat wafer is placed, each wafer having etched therein holes defining the grid mesh. The frame maintains the geometric conformal shape allowing large units to be constructed.

13 Claims, 3 Drawing Figures

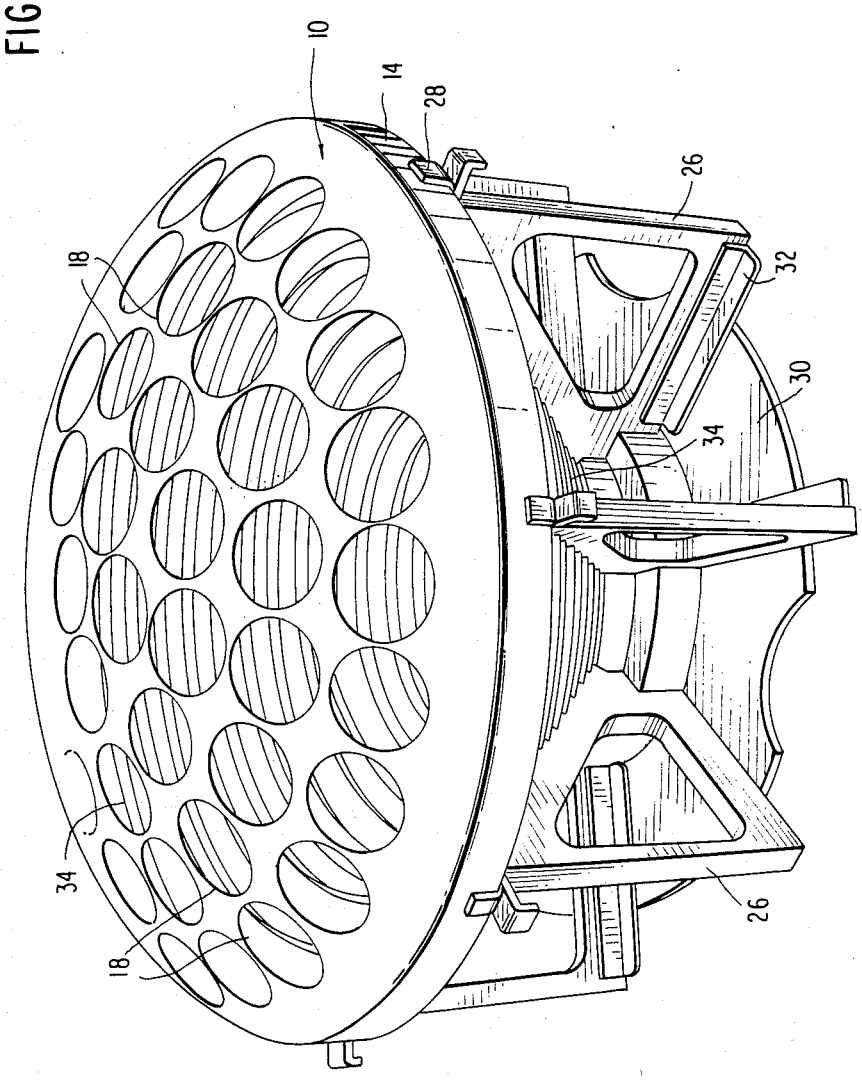

SPHERICAL RETARDING GRID ANALYZER

BACKGROUND OF THE INVENTION

1. Technical Field

This invention relates to a retarding grid and in particular a spherical retarding grid used for energy resolution in charged particle systems.

2. Prior Art

Retarding grids are commonly employed in a variety of different charged particle systems, such as electron energy instruments and spectroscopy applications typified by Auger, photoemission, and energy loss spectroscopy. Typical prior art systems employ a wire mesh retarding grid. Such are limited in size due to manufacturing instability considerations or dynamic constraints.

Reference is made to Wei et al, "Instrumental Effects of the Retarding Grids in a LEED Apparatus", *The Review of Scientific Instruments*, Vol. 40, No. 8, pp. 1075–1079, August 1969, and Weber et al, "Use of LEED Apparatus for the Detection and Identification of Surface Contaminants", *J. App. Phy.*, Vol. 38, No. 11, pp. 4355–4358, October 1967, which discuss wire mesh grid systems in the context of low energy electron defraction (LEED). The use of a mesh electrode for a cathode ray tube is set forth in Kokai No. 55-62790, May 14, 1980, wherein a planar mesh deforms under exposure to a high pressure gas to assume a curved shape conforming to a predefined cavity portion.

Another example of flexible grids for purposes of achieving beam concentration by having the grid deflect as a function of the voltage difference between it and generated ion plasma is disclosed in U.S. Pat. No. 4,538,067. Set forth therein, degree of focusing is a function of bowing of the flexible grid for purposes of extracting and accelerating ions from an ion plasma with the resulting high energy ion beam focussed onto a small area. The technique of manufacturing curved ion thrust to grids is disclosed in U.S. Pat. No. 3,864,797. The technique employed therein involves a simultaneous manufacture of grid pairs, an acceleration grid and a screen grid by employing a forcing fluid to inflate an impervious elastic sheet which contacts the grid blanks which forces bowing. Such grids are used as a part of an ion thrust of accelerator systems defined in the '797 patent for use as a thruster for spacecraft.

In terms of electron spectroscopy, the use of spherical grids is disclosed in Palmberg, "Optimization of Auger Electron Spectroscopy in LEED Systems", *App. Phy. Let.*, Vol. 13, No. 5, pp. 183–185, September 1968; Taylor, "Resolution and Sensitivity Considerations of an Auger Electron Spectrometer Based on Display LEED Optics", *The Review of Scientific Instruments*, Vol. 40, No. 6, pp. 792–804, June 1969; Samson et al, "Photoelectron Spectoscopy of the Rare Gases", *The Physical Review*, Vol. 173, pp. 80–85 (1968); and Huchital et al, "High-Sensitivity Electron Spectrometer", *App. Phy. Let.*, Vol. 16, No. 9, pp. 348–351, May 1970. In more general terms, analysis of spherical-grid retarding analyzers which summarizes and comments on many of the just cited citations is found in Huchital et al, "Resolution and Sensitivity of the Spherical-Grid Retarding Potential Analyzer", *J. Appl. Phys.*, Vol. 43, No. 5, pp. 2291–2302, May 1972. As illustrated in FIG. 6 of that reference and disclosed throughout the body of the text, spherical retarding grid analyzers have been employed for many types of charged particles spectroscopy applications. The energy resolution of such devices is given by $$\frac{\Delta E}{E} \approx \left(\frac{r}{R}\right)^2$$

where: r is the radius of the charged particle source and R is the radius of the spherical analyzer. As set forth in Huchital et al, there is general recognition that the grid mesh size also influences overall resolution. The publication accurately summarizes the state of the art in grid energy resolution as of 1972 which it is believed was also pertinent as of the time of this invention. Typically, energy resolution is in the order of one part in 200. One of the critical limiting aspects of achieving higher degree of resolution is the precision in which the fine mesh grids can be made spherical. Consequently, as set forth in the prior art, a variety of techniques have been proposed for the manufacture of such grids to maintain spherical configuration. As set forth herein, U.S. Pat. No. 3,864,797 and Japan Kokai No. 55-62790 are representative of various attempts within the art. Given manufacturing constraints, however, there is a size limitation inherent in all such prior art manufacturing processes. Consequently, a requirement for a larger device carries with it the co-commitment loss in energy resolution. Prior to this invention, it is believed that no system provided the necessary flexibility that the virtual elimination of size as a function of energy resolution which could be obtained in the spherical retarding grid analyzer.

SUMMARY OF THE INVENTION

Given deficiencies in the prior art, it is an object of this invention to provide a spherical retarding grid analyzer having improved energy resolution without size limitation.

Yet another object of this invention is to provide a large spherical retarding grid analyzer wherein the mesh grid may be chosen to any specific energy resolution having no influence on the overall precision of the spherical arc configuration.

A still further object of this invention is to provide a spherical retarding grid which can be made to any size without loss of energy resolution.

In accordance with this invention, a spherical retarding grid is made utilizing a large number of flat elements which are held in place by a rigid frame. The frame is made from a non-magnetic material such as aluminum. The individual grid elements preferably are silicon wafers having anistropically etched in the wafers individual grid elements to define the grid openings. As an alternative to silicon wafers, graphite grids may be used.

This invention, therefore, represents a complete departure from prior systems. That is, rather than attempt to manufacture a large wire mesh grid, the present invention relies on a rigid spherical frame having a large number of flat portions, each of which can be made and reproduced with great uniformity and precision. The grid itself is made of plurality of flat elements mounted on the frame. The overall energy resolution of the system is much greater than that which is presently obtained. The spherical dome, a structurally rigid element can be made as large as required and it is only necessary that the placement of the individual grids to be conformal to a spherical surface. Consequently, very large spherical analyzers having high energy resolution can be constructed.

Another advantage of this invention is that the grid may be electronically biased or, alternatively, only portions may be biased. This provides a control feature which is not found on existing grids. If necessary, active circuitry such as counters, sensors and amplifiers can be provided on the silicon wafers.

Given the overall grid structure having a fixed frame, the system is maintained with a fixed focal point which does not vary during use and is relatively insensitive to environmental changes. For example, it is not subject to small perturbations in magnetic fields and, fringe field aberrations are not as critical as in single wire mesh grid systems.

This invention will be described in greater detail by referring to the attached drawings and description of the preferred embodiments that follows.

BRIEF DESCRIPTION OF THE DRAWINGS

FIG. 3 is a schematic perspective view of an embodiment of the invention as an electrostatic retarding grid analyzer.

DESCRIPTION OF THE PREFERRED EMBODIMENT

Figure 2:
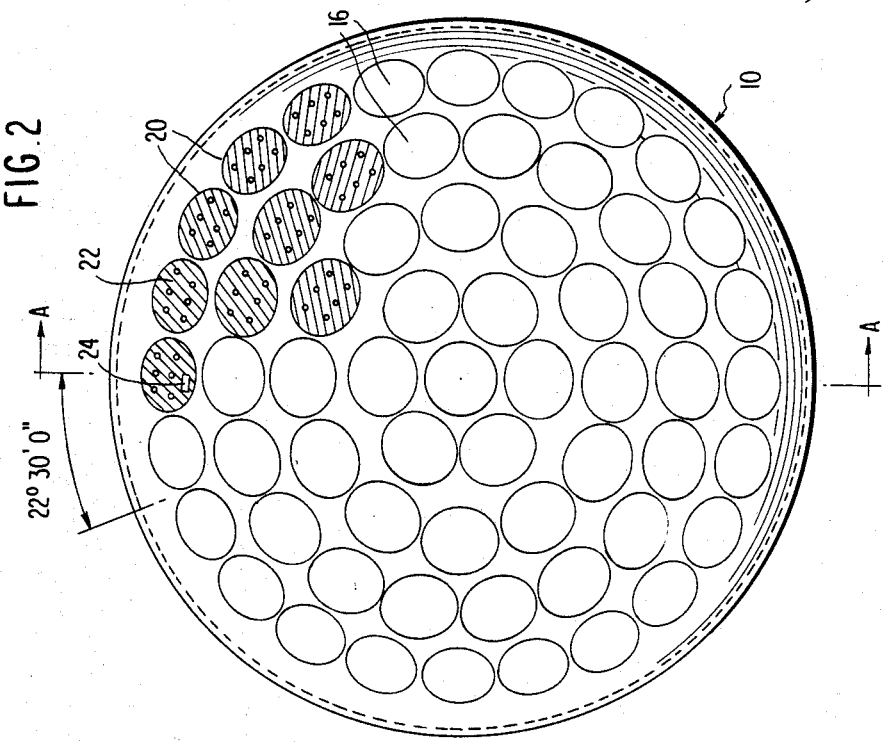
FIG. 2 is a top view of the retarding grid of this invention.
Figure 1:
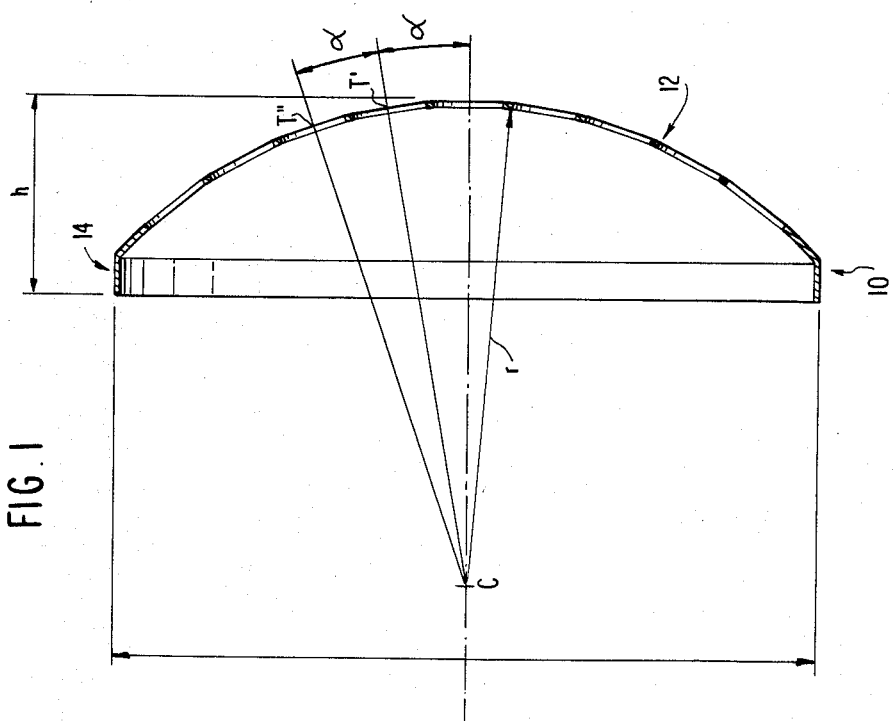
FIG. 1 is a schematic side view of the grid of this invention.

Referring now to the figures of the preferred embodiment of this invention as disclosed, in particular FIGS. 1 and 2 illustrate the frame element 10 comprising a metallic non-magnetic co-spherical surface. The frame 10 has a radius r defining the spherical portion 12. The flanged portion 14 is employed to provide the necessary surface for mounting to an adjacent surface or the like.

As illustrated in FIG. 2, the frame 10 has a large number of holes 16. The holes are equally spaced as illustrated in FIG. 3. Thus, as illustrated in FIGS. 1 and 2 at tangential points T' defined as the intersection of the radius R' from the spherical center C, holes, equally spaced of an appropriate diameter may be geometrically centered vis-a-vis the top point of the spherical surface. FIG. 2 illustrates those holes as elements 16. Similarly, at tangential point T" at the point of intersection of radius line R", a second ring of equally spaced holes may also be located. In this illustrated example, the second ring contains 12 holes equally spaced, while the third ring contains 18 holes equally spaced and a fourth, 24 holes holes equally spaced. It is understood that the number of holes in any ring and, the number of rings is a function of the size of the elements to be placed in each hole and, the overall size of the retarding grid. Consequently, the number of holes and the number of rings varies depending on the overall size of the instrument and the dimensions of the planar elements which are placed into each hole. Moreover, while circular openings are illustrated, they may be in any shape. The packing density is a function of shape and may be optimized depending on the application of the grid. In accordance with this invention, a semiconductor wafer is placed in each hole. Each of the wafers is flat. However, as illustrated in FIG. 1, overall spherical conformity of the device remains. Each of the silicon wafers functionally comprises an individual grid. FIG. 2 illustrates placement of wafers 20 in a portion of the holes. It will be understood that each of the holes illustrated in FIGS. 2 and 3 will house such wafers when the device is completed. Consequently, the composite grid composes a plurality of flat wafers 20.

Each of the wafers 20 has a plurality of grid openings which are formed by anistropically etching the wafers. This technique of etching a material such as silicon is well known in the art. Those grid openings are shown schematically as elements 22, it being understood that a great number of small openings will be present in each wafer.

Thus, individual grid elements are made from semiconductor wafers, each of the wafers having grid openings defined therein by appropriate etching techniques. Materials other than silicon may be used, for example, graphite rods.

In one implementation of the analyzer of this invention, diameter of the overall dome is 20.625 inches. The wafers are 2.25 inches in diameter. Given this basic geometry, the overall height of the dome as indicated in FIG. 1 as the dimension h is 5.75 inches. The radial spacing between the rings of holes, it is arcuate distant α as illustrated in FIG. 1 is 90° 34'30". In this example of the device the inside radius r would be 13.779 inches. The grid size in the wafer is 50 mesh. Resolution of the spherical grid analyzer in accordance with this example is better than one part in 2,000. Transmission of the device is in the range of 3%. It will be appreciated that the resolution of the device is a function of the grid size and spacing. Given the use of a flat rigid material such as a silicon wafer this invention provides design flexibility in this area.

While this example is set forth for purposes of illustration, there is no upper limit on the size of the analyzer which may be built. Consequently, there is no known upper limit on resolution. Rather, by utilizing a rigid frame, typically aluminum and defining individual grids formed of flat sections, the only geometric limitation is the ability to place the individual grids to define a conformal spherical surface. As the device size decreases, then size of the individual flat grid elements must also decrease such that the spherical surface can still be defined. However, the size of the grid increases, then placement of the individual grids to define a conformal spherical surface becomes easier and the number of grids either increase or, the size of each grid may increase.

An important aspect of this invention is that given use of flat semiconductor elements, active circuitry may be placed on any of the wafers 20. Such circuitry can comprises sensors or detectors placed on any wafer either between grid holes or on the edges of the wafer. FIG. 2 illustrates in schematic form the presence of a circuit as element 24. In the case of a silicon substrate standard semiconductor processing techniques may be employed to create the necessary circuit in the wafer. Such detectors could be used to detect the presence of radiation, specific positioning within the grid, amplification or enhancement. Moreover, given the presence of circuitry on the wafers, the entire grid may be electronically biased, or only portions biased. This provides a control feature not found on present day grids.

FIG. 3 illustrates one application of the invention in an electrostatic retarding grid analyzer. The spherical frame 10 and flange 14 are mounted on dielectric legs 26. A series of circumferentially spaced tabs attach to the frame 14. The legs 26 may be made from quartz or other dielectric material. The legs in turn are fastened on to the base plate 30 by flange elements 32. The base plate is the mounting point of attachment of the grid to the vacuum chamber, not illustrated.

A series of field defining rings 34 are illustrated in FIG. 3. The rings 34 define the edges of the field to compensate for the lack of a complete spherical shape of the frame. FIG. 3 illustrates the rings as concentric and of decreasing diameter toward the focal point. In will be appreciated that the shape and spacing that is, the geometry of the rings 34 can be changed depending on the application involved and the shape of the desired field. As illustrated in FIG. 3 the rings are positioned on the legs 26.

Given the advantages of this invention, an analyzer may be used for energy analysis or momentum analysis of any charged particles. Given the high energy resolution, specific application in a number of areas not previously perceived becomes possible with this invention. The device can be used as a high resolution solid angle particle analyzer. In the field of surface science, the unique ability of this device having a focal point allows it to be used for beam experiments. Thus UPS and SPX techniques can be extended to higher energy electrons. Such allows experiments in surface science to use higher energy electrodes having sufficient information to provide basic information on surfaces such as deep core studies.

Another use of the analyzer would be as a focusing detector for extraterrestial particles. It is appreciated that the device would be used in the reverse mode as a focusing detector. Also, when used in space the size of the device is not limited by the size of any vacuum chamber. Consequently, a device of any size, for example 100 meters in diameter could be constructed.

Other modes of utilization or alternative constructions will be apparent for those of working skill in this technology. Such modifications are within the scope of this invention.

Having described our invention, we claim:

1. A spherical grid for focussing charged particles comprising:
    a rigid spherical frame having a number of openings therein; and
    flat grid elements defining a mesh for said spherical grid placed in said openings.
2. The spherical grid of claim 1 wherein said flat grid elements comprise silicon wafers.
3. The spherical grid of claim 2 further comprising holes in aid silicon wafers defining said grid.
4. The spherical grid of claim 2 further comprising a circuit element on at least one of said silicon wafers.
5. The spherical grid of claim 1 wherein said openings are uniformly spaced on said spherical frame to define a regular pattern of openings on the spherical frame.
6. The spherical grid of claim 1 further comprising a flange section attached to said spherical frame.
7. The spherical grid of claim 6 wherein said flange section is cylindrical and integral with said spherical frame.
8. The spherical grid of claim 1 wherein said flat grid elements are sized to maintain spherical conformity with said spherical frame.
9. The spherical grid of claim 1 further comprising an instrument having a source of charged particles on one side of said spherical grid and collector means on the other side of said spherical grid for collecting charged particles passing through said spherical grid.
10. The spherical grid of claim 1 wherein said spherical frame comprises a non-magnetic material.
11. The spherical grid of claim 1 further comprising a dielectric support for said spherical frame.
12. The spherical grid of claim 11 wherein said dielectric support comprises a series of quartz legs spaced around said spherical frame.
13. The spherical grid of claim 12 further comprising a series of concentric field defining and terminating rings.

* * * * *

UNITED STATES PATENT AND TRADEMARK OFFICE
CERTIFICATE OF CORRECTION

PATENT NO. : 4,714,831

DATED : December 22, 1987

INVENTOR(S) : Gregory J. CLARK et al

It is certified that error appears in the above-identified patent and that said Letters Patent is hereby corrected as shown below:

Column 1, line 27 and Column 2, line 22,
   "KOKAI No. 55-62790" should be

-- Japanese Published Unexamined Patent Application (Japan KOKAI) 56-159037 --.

Signed and Sealed this

Seventeenth Day of May, 1988

Attest:

DONALD J. QUIGG

Attesting Officer

Commissioner of Patents and Trademarks